US011791334B2

(12) United States Patent
Jain et al.

(10) Patent No.: US 11,791,334 B2
(45) Date of Patent: Oct. 17, 2023

(54) HETEROJUNCTION BIPOLAR TRANSISTOR WITH BURIED TRAP RICH ISOLATION REGION

(71) Applicant: GLOBALFOUNDRIES U.S. Inc., Santa Clara, CA (US)

(72) Inventors: Vibhor Jain, Williston, VT (US); John J. Ellis-Monaghan, Grand Isle, VT (US); Anthony K. Stamper, Burlington, VT (US); Steven M. Shank, Jericho, VT (US); John J. Pekarik, Underhill, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 62 days.

(21) Appl. No.: 17/075,056

(22) Filed: Oct. 20, 2020

(65) Prior Publication Data

US 2022/0122968 A1  Apr. 21, 2022

(51) Int. Cl.
*H01L 27/08* (2006.01)
*H01L 27/082* (2006.01)
*H01L 27/06* (2006.01)
*H01L 29/737* (2006.01)
*H01L 29/06* (2006.01)

(52) U.S. Cl.
CPC ........ *H01L 27/082* (2013.01); *H01L 27/0647* (2013.01); *H01L 29/0646* (2013.01); *H01L 29/737* (2013.01)

(58) Field of Classification Search
CPC ............... H01L 27/082; H01L 27/0647; H01L 29/0646; H01L 29/737; H01L 21/8249; H01L 27/0623; H01L 21/82285; H01L 27/0826; H01L 29/0817; H01L 29/1004; H01L 29/66242; H01L 29/7371; H01L 21/76224; H01L 21/763
See application file for complete search history.

(56) References Cited

U.S. PATENT DOCUMENTS

| 5,723,896 A * | 3/1998 | Yee ............... H01L 21/26506 |
| | | 257/E21.564 |
| 6,767,797 B2 | 7/2004 | Krutsick |
| 7,476,914 B2 | 1/2009 | Dokumaci et al. |
| 7,846,805 B2 | 12/2010 | Zhang et al. |
| 7,855,404 B2 | 12/2010 | Heinemann et al. |
| 7,880,270 B2 | 2/2011 | Heinemann et al. |

(Continued)

OTHER PUBLICATIONS

Specification and drawings in U.S. Appl. No. 16/553,737, filed Aug. 26, 2019, 18 pages.

(Continued)

*Primary Examiner* — Shouxiang Hu
(74) *Attorney, Agent, or Firm* — Francois Pagette; Andrew M. Calderon; Calderon Safran & Cole. P.C.

(57) ABSTRACT

The present disclosure relates to semiconductor structures and, more particularly, to heterojunction bipolar transistors (HBTs) with a buried trap rich isolation region and methods of manufacture. The structure includes: a first heterojunction bipolar transistor; a second heterojunction bipolar transistor; and a trap rich isolation region embedded within a substrate underneath both the first heterojunction bipolar transistor and the second heterojunction bipolar transistor.

12 Claims, 10 Drawing Sheets

(56) References Cited

U.S. PATENT DOCUMENTS

| | | | |
|---|---|---|---|
| 7,972,919 B2 | 7/2011 | Gray et al. | |
| 8,035,167 B2 | 10/2011 | Knoll et al. | |
| 9,640,528 B2 | 5/2017 | Preisler et al. | |
| 9,721,969 B2 * | 8/2017 | Verma | H01L 21/8213 |
| 9,761,700 B2 | 9/2017 | McPartlin | |
| 9,941,170 B2 | 4/2018 | Chevalier et al. | |
| 10,192,779 B1 * | 1/2019 | Shank | H01L 21/26533 |
| 10,367,083 B2 | 7/2019 | Jain et al. | |
| 10,468,294 B2 | 11/2019 | Peidous et al. | |
| 2019/0027436 A1 | 1/2019 | Lum | |
| 2019/0080957 A1 | 3/2019 | Peidous et al. | |
| 2019/0109055 A1 | 4/2019 | Preisler et al. | |
| 2019/0140072 A1 | 5/2019 | Chevalier | |
| 2021/0074551 A1 * | 3/2021 | Cheng | H01L 29/0649 |

OTHER PUBLICATIONS

Babcock et al. "Advantages of SiGe-pnp over Si-pnp for analog and RF enhanced CBiCMOS and Complementary Bipolar design usage", IEEE, 2016, 10 pages.

Specification and drawings in U.S. Appl. No. 16/598,064, filed Oct. 10, 2019, 23 pages.

Specification and drawings in U.S. Appl. No. 17/074,891, filed Oct. 20, 2020, 27 pages.

Office Action in related U.S. Appl. No. 17/074,891 dated Dec. 20, 2022, 8 pages.

Response to Office Action in related U.S. Appl. No. 17/074,891 dated Mar. 20, 2023, 10 pages.

Notice of Allowance in related U.S. Appl. No. 17/074,891 dated Apr. 17, 2023, 9 pages.

\* cited by examiner

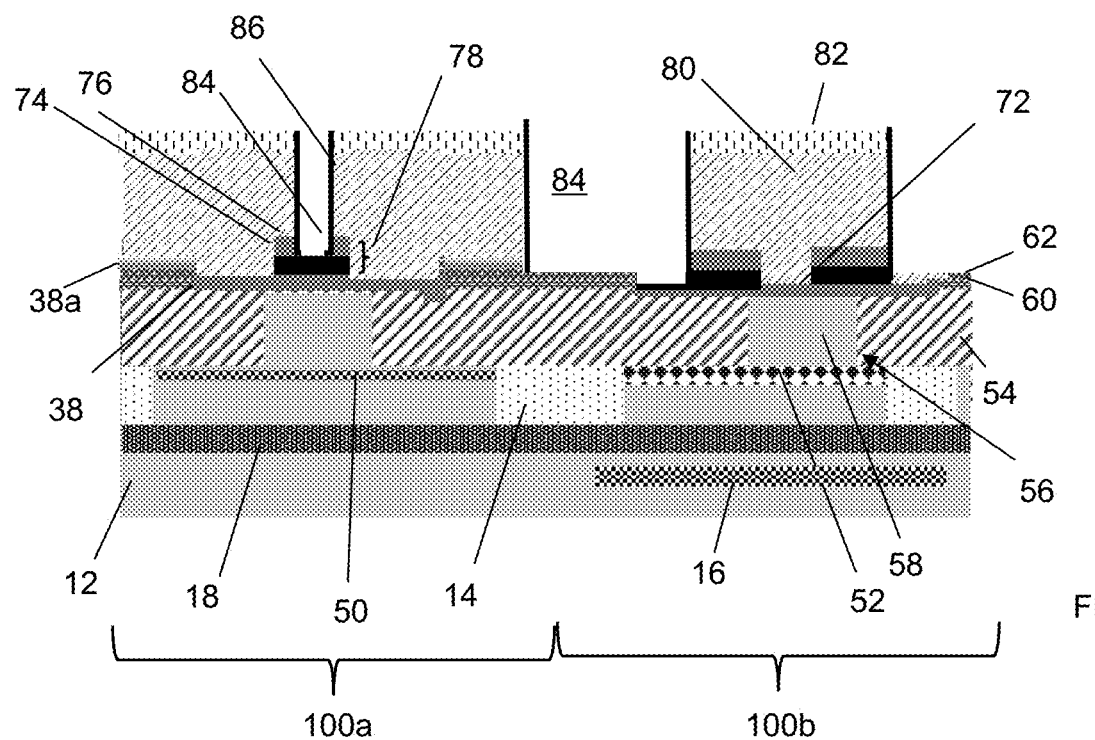

HETEROJUNCTION BIPOLAR TRANSISTOR WITH BURIED TRAP RICH ISOLATION REGION

FIELD OF THE INVENTION

The present disclosure relates to semiconductor structures and, more particularly, to heterojunction bipolar transistors (HBTs) with a buried trap rich isolation region and methods of manufacture.

BACKGROUND

A heterojunction bipolar transistor (HBT) is a type of bipolar junction transistor (BJT) which uses differing semiconductor materials for the emitter and base regions or collector and base regions, creating a heterojunction. Si/SiGe HBTs are used in power amplifier applications due to good RF performance, high breakdown voltage and integration with CMOS.

High performance devices can be implemented with use of HBTs. These are utilized in bipolar based analog chips like op-amps, wideband variable gain amplifiers, high performance data converters (ADC, DAC) among others. These high performance devices require silicon-on-insulator (SOI) technologies due to latch-up and leakage concerns. For example, SOI can significantly improve latch-up sensitivity since there is no longer concern about complex parasitic npnp structures and injected current paths. The use of SOI wafers, though, add significant cost to the fabrication process, increased self-heating and can have stress induced yield interactions. Also, SOI wafers are not needed for simpler circuits which have lower performance designs.

SUMMARY

In an aspect of the disclosure, a structure comprises: a first heterojunction bipolar transistor; a second heterojunction bipolar transistor; and a trap rich isolation region embedded within a substrate underneath both the first heterojunction bipolar transistor and the second heterojunction bipolar transistor.

In an aspect of the disclosure, a structure comprises: a bipolar heterojunction transistor; a field effect transistor adjacent to the bipolar heterojunction transistor; shallow trench isolation structures separating the bipolar heterojunction transistor from the field effect transistor; and a trap rich isolation region under the both the bipolar heterojunction transistor and the field effect transistor, under the shallow trench isolation structures.

In an aspect of the disclosure, a structure comprises: a first type of heterojunction bipolar transistor; a second type of heterojunction bipolar transistor, different from the first type of heterojunction bipolar transistor; a trap rich isolation region embedded within a substrate underneath both the first heterojunction bipolar transistor and the second heterojunction bipolar transistor; and an isolation region within the substrate, under the trap rich isolation region and the second type of heterojunction bipolar transistor.

BRIEF DESCRIPTION OF THE DRAWINGS

The present disclosure is described in the detailed description which follows, in reference to the noted plurality of drawings by way of non-limiting examples of exemplary embodiments of the present disclosure.

FIGS. 5-13 show alternative fabrication processes and a resultant structure (FIG. 13) comprising complementary HBT devices over a trap rich isolation region in accordance with aspects of the present disclosure.

DETAILED DESCRIPTION

The present disclosure relates to semiconductor structures and, more particularly, to heterojunction bipolar transistors (HBTs) with a buried trap rich isolation region and methods of manufacture. More specifically, the present disclosure relates to a SiGe PNP HBT and complementary SiGe NPN HBT over a trap rich region. Advantageously, the present disclosure provides an improved thermal PNP and NPN solution, compared to SOI technologies. In addition, the use of the buried trap rich isolation region reduces and/or eliminates latch-up issues, leakage and high voltage swings compared to bulk technologies. It is also possible to integrate the high performance technologies with FET switches and other devices, e.g., logic and lower noise amplifiers, etc.

In embodiments, a trap rich isolation region, e.g., polysilicon, can be provided on a handle wafer under a crystalline silicon layer and under a PNP device and/or NPN device. For example, a SiGe PNP HBT and/or NPN HBT can be provided on a bulk wafer, e.g., composed of crystalline silicon, with a trap rich isolation region below the PNP device and/or NPN device. In embodiments, the trap rich isolation region contacts shallow trench isolation structures of both devices. A sub-collector of the HBT(s) can be contained within the shallow trench isolation structures, vertically separated from the trap rich isolation region. Also, a low concentration doping region, e.g., n-type isolation, can be provided below the trap rich isolation region of the HBT; although other alternative integration schemes are contemplated herein. The trap rich isolation region can further separate regions for switch, logic and low power amplifier (LNA) FETs, as an example.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
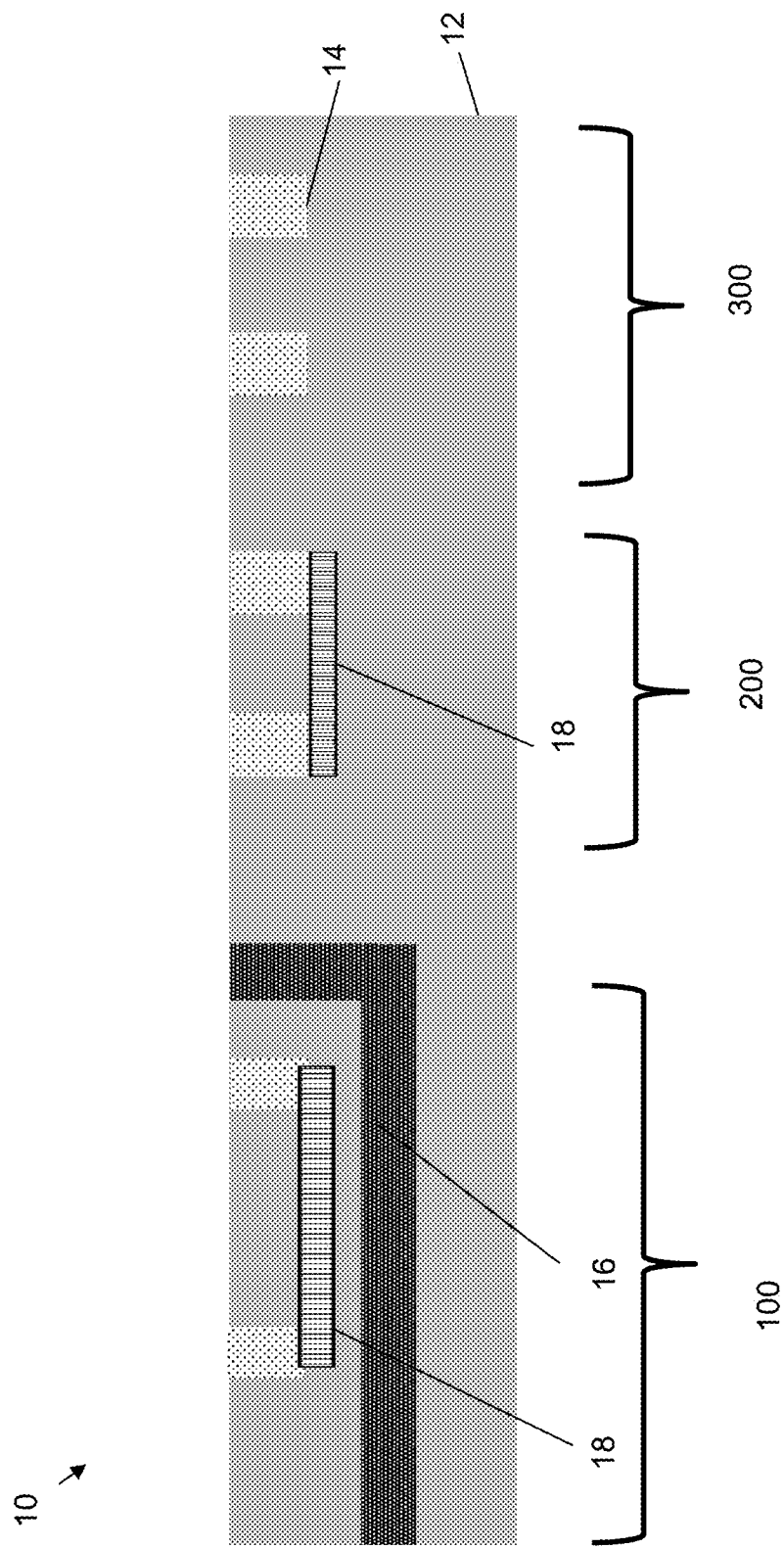
FIG. 1 shows a substrate with trap rich isolation regions (e.g., layer), amongst other features, and respective fabrication processes in accordance with aspects of the present disclosure.

FIG. 1 shows a substrate with trap rich isolation regions (e.g., layer), amongst other features, and respective fabrication processes. More specifically, the structure 10 of FIG. 1 includes a bulk substrate 12, preferably composed of single crystalline Si material with any suitable crystallographic orientation (e.g., a (100), (110), (111), or (001) crystallographic orientation). The substrate 12 may have a high resistivity (e.g., 100 ohm-cm or greater) and can also be composed of other bulk, single crystalline semiconductor materials, including but not limited to, Si, SiGe, SiGeC, SiC, GaAs, InAs, InP, and other III/V or II/VI compound semiconductors. For purposes of discussion, the substrate 12 is shown with three distinct device regions: a HBT device region 100, a switch/LNA FET region 200 and a logic FET region 300.

Still referring to FIG. 1, shallow trench isolation structures 14 can be formed in the substrate 12. For example, the shallow trench isolation structures 14 can be formed in the HBT device region 100, switch/LNA FET region 200 and logic FET region 300. The shallow trench isolation structures 14 can be formed by conventional lithography, etching and deposition methods known to those of skill in the art. By way of example, a resist formed over the substrate 12 is exposed to energy (light) to form a pattern (opening). An etching process with a selective chemistry, e.g., reactive ion etching (RIE), can be used to form one or more trenches in the substrate 12 through the openings of the resist. Following resist removal by a conventional oxygen ashing process or other known stripants, insulator material, e.g., $SiO_2$, can be deposited by any conventional deposition processes, e.g., chemical vapor deposition (CVD), to form the shallow trench isolation structures 14. Any residual insulator material on the surface of the substrate 12 can be removed by conventional chemical mechanical polishing (CMP) processes.

An isolation region 16 can be provided under the shallow trench isolation structures 14 in the HBT device region 100. In embodiments, the isolation region 16 can be a high concentration doping region, e.g., n-type implant region. As shown, the isolation region 16 can be vertically below and does not contact the shallow trench isolation structures 14; instead, the substrate 12 separates the shallow trench isolation structures 14 and the isolation region 16. The isolation region 16 also extends to the surface of the substrate 12 on a side of a shallow trench isolation structure 14, formed by using a high dosage implant process.

In embodiments, the isolation region 16 can be formed by an implantation process, e.g., using an n-type implant. The n-type dopants include, e.g., Arsenic (As), Phosphorus (P) and Sb. In the implantation process, a patterned implantation mask can be used to define selected areas exposed for the implantation of the isolation region 16, e.g., HBT device region 100. The implantation mask may include a layer of a light-sensitive material, such as an organic photoresist, applied by a spin coating process, pre-baked, exposed to light projected through a photomask, baked after exposure, and developed with a chemical developer. The implantation mask also has a thickness and stopping power sufficient to block masked areas against receiving a dose of the implanted ions. The implantation mask can be stripped after implantation. Depending on the parameters of the implantation process, the isolation region 16 could diffuse into the substrate 12 to different depths below and not in contact with the shallow trench isolation structures 14.

FIG. 1 further shows separate trap rich isolation regions 18 in both the HBT device region 100 and the switch/LNA FET region 200. In embodiments, the trap rich isolation regions 18 are discontinuous, e.g., separated by the substrate 12, with the isolation region 16 capable of surrounding the trap rich isolation region 18 in the device region 100. The trap rich isolation regions 18 can be a high resistivity region, e.g., higher than the resistivity of the substrate 12. In embodiments, the trap rich isolation regions 18 contact the shallow trench isolation structures 14 in both the HBT device region 100 and the switch/LNA FET region 200 in order to improve device to device isolation and to significantly reduce substrate leakage. Also, as shown, the trap rich isolation regions 18 in the HBT device region 100 can be vertically separated from the isolation region 16 by material of the substrate 12. In this way, the trap rich isolation regions 18 in the HBT device region 100 will not contact the isolation region 16.

The trap rich isolation regions 18 can be a damaged silicon layer, e.g., poly-crystalline semiconductor material, with a high resistivity. In embodiments, the trap rich isolation regions 18 are formed by an argon implant process using a patterned implantation mask used to define selected areas exposed for the implantation, e.g., HBT device region 100 and switch/LNA FET region 200. The implant process can, alternatively, use any non-dopant or noble gas element (e.g., Xe). The dose of the implant damages the substrate 12, while also ensuring that recrystallization of any damaged semiconductor material can be repaired in the regions 100, 200 by a subsequent anneal. For example, the substrate 12 can be subjected to an argon implant at a concentration of less than $1.0 \times 10^{17}$ $cm^{-2}$. By way of further illustrative examples, other implant parameters are contemplated herein depending on the desired thickness and depth of the implant region including, e.g., the ion dose may be less than or greater than $1.25 \times 10^{15}$ $cm^{-2}$ or within a range of $1 \times 10^{13}$ $cm^{-2}$ to $5 \times 10^{16}$ $cm^{-2}$. The depth of the trap rich isolation region 14 can be adjusted depending on the dosage of the implantation process.

Following the implantation process, an anneal process can be used to recrystallize the substrate 12 in the HBT device region 100 and the switch/LNA FET region 200. For example, an anneal process recrystallizes the trap rich isolation region 14 into a single crystal region. In particular, the thermal process repairs or heals the damage to (i.e., recrystallize or regrow) the semiconductor material of the modified layer. For example, the anneal may be a rapid thermal anneal (RTA) performed with a peak temperature in a range of 860° C. to 1125° C. with a dwell time at the peak temperature of 34 milliseconds to 60 seconds and, in a particular, the peak temperature may be 1000° C. held for a dwell time of 5 seconds. In this way, the HBT device region 100 and the switch/LNA FET region 200 includes a trap rich isolation region 18 in contact with the shallow trench isolation structures 14.

Figure 2:
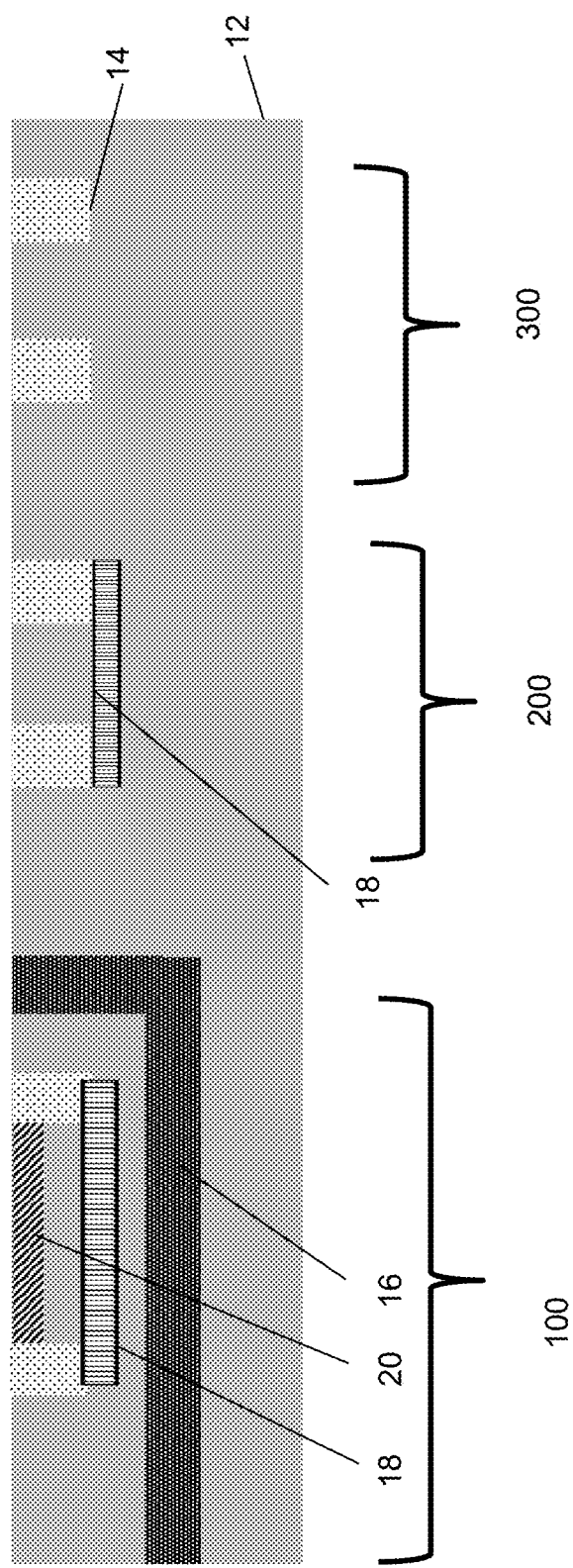
FIG. 2 shows a sub-collector region bounded by shallow trench isolation structures, amongst other features, and respective fabrication processes in accordance with aspects of the present disclosure.

FIG. 2 shows a sub-collector region 20 in the HBT device region 100. The sub-collector region 20 can be a p-type sub-collector formed by an implant process. In embodiments, the p-type implant can be, e.g., Boron (B), which can be bounded or constrained within the shallow trench isolation structures 14. To accomplish this integration scheme, a patterned implantation mask defines, e.g., expose, a region between the shallow trench isolation structures 14 of the HBT device region 100. Also, the energy and dosage of the implant can be adjusted to ensure that there is no contact between the sub-collector region 20 and the trap rich isolation region 18. Accordingly, the trap rich isolation regions 18 in the HBT device region 100 can be vertically separated from the sub-collector region 20 by the substrate 12, e.g., single crystalline semiconductor material.

Figure 3:
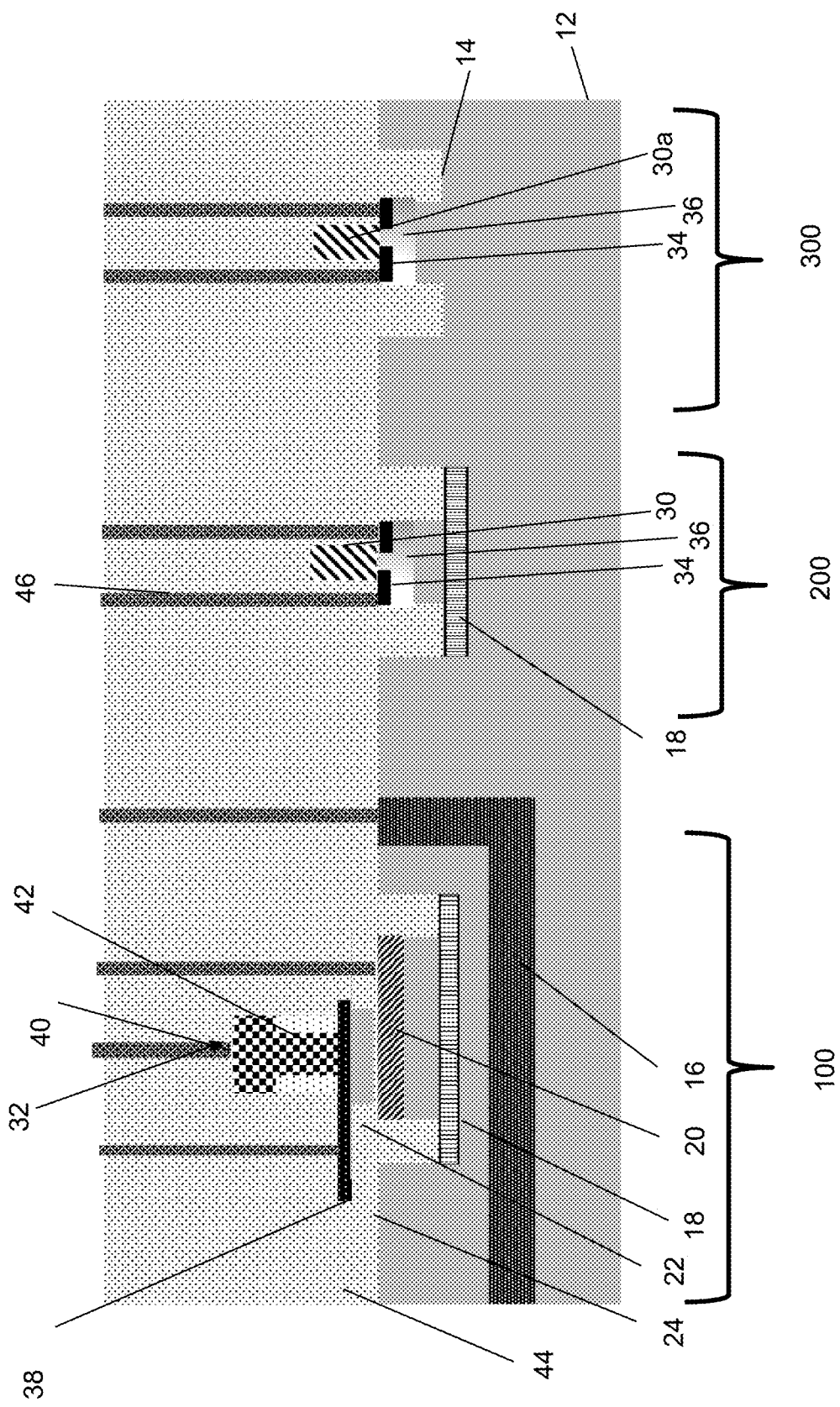
FIG. 3 shows various devices above the trap rich isolation region (e.g., layer), amongst other features, and respective fabrication processes in accordance with aspects of the present disclosure.

FIG. 3 shows devices in each of the regions 100, 200, 300. For example, the device regions 200, 300 each include a transistor 30, 30a, respectively; whereas, the HBT device region 100 includes a SiGe PNP bipolar heterojunction transistor 32. In embodiments, the transistor 30 can be a switch or LNA FET provided over the trap rich isolation region 18; whereas, the transistor 30a can be a logic transistor devoid of any trap rich isolation region. Moreover, the SiGe bipolar heterojunction transistor 32 can be a SiGe power amplifier, as an example, over the trap rich isolation region 18.

Referring to regions 200, 300, the transistors (e.g., FETs) 30, 30a each include source/drain regions 34 formed in a N-well 36. The source/drain regions 34 and the N-well 36 can be formed by conventional ion implantation processes as is known in the art such that no further explanation is required for a complete understanding of the present disclosure. In alternative examples, the source/drain regions 34 can be raised source and drain regions formed by a doped epitaxial process.

As further shown, the source/drain regions 34 and the N-well 36 of the transistors 30, 30a can be isolated by the shallow trench isolation structures 14. In addition, the N-well 36 of the transistors can be isolated from the trap rich isolation region 18; that is, the N-well 36 of the transistor 30 does not contact the trap rich isolation region 18.

The transistors 30, 30a can be formed using conventional gate formation processes, e.g., gate first processes or replacement gate processes. For example, in the gate first processes, a gate dielectric material and workfunction material(s) are deposited and patterned using conventional CMOS fabrication process as is known in the art such that no further explanation is required for a complete understanding of the present disclosure. A sidewall material, e.g. oxide or nitride, can be formed on the patterned gate dielectric material and workfunction materials using conventional deposition processes followed by an anisotropic etching process. The gate dielectric material can be a high-k gate dielectric material, e.g., HfO$_2$. Examples of the workfunction materials for a p-channel FET include Ti, TiAlC, Al, TiAl, TaN, TaAlC, TiN, TiC and Co. Examples of the workfunction materials for an n-channel FET include TiN, TaN, TaAlC, TiC, TiAl, TaC, Co, Al, TiAl, HfTi, TiSi, TaSi or TiAlC. The workfunction materials may be deposited by chemical vapor deposition (CVD), physical vapor deposition (PVD) including sputtering, atomic layer deposition (ALD) or other suitable method.

In the HBT device region 100, the bipolar heterojunction transistor 32 includes an intrinsic layer of Si material 22, e.g., collector region, in direct contact with the sub-collector region 20. Insulator material 24 also surrounds portions of the intrinsic layer of Si material 22. A base region 38 can be formed on the intrinsic layer of Si material 22, and an emitter region 40 can be formed on the base region 38. The base region 38 and intrinsic layer of Si material 22 can be deposited by a conventional CVD process, followed by conventional lithography and etching (e.g., patterning) processes. The base region 38 can be composed of doped SiGe material, e.g., p-type dopant such as Boron (B). It is understood that the base region 38 can also have an intrinsic base and an extrinsic base layer.

The emitter region 40 can be Si material, as an example. In embodiments, the Si material can be doped with a n-type dopant, e.g., Arsenic (As), Phosphorus (P) and Sb, among other suitable examples. The emitter region 40 can be formed, e.g., deposited, by a conventional CVD process, followed by conventional lithography and etching (e.g., patterning) processes. Sidewalls 42 are formed on the emitter region 40, e.g., oxide material, as is known in the art.

Following the formation of the respective devices in regions 100, 200, 300, a silicide process can be provided to form contacts to the appropriate active regions, e.g., source/drain regions 34, base region 38, emitter region 40, isolation region 16, collector region 20, etc. As should be understood by those of skill in the art, the silicide process begins with deposition of a thin transition metal layer, e.g., nickel, cobalt or titanium, over fully formed and patterned devices. After deposition of the material, the structure can be heated allowing the transition metal to react with exposed silicon (or other semiconductor material as described herein) in the active regions of the semiconductor device (e.g., source, drain, etc.) forming a low-resistance transition metal silicide. Following the reaction, any remaining transition metal can be removed by chemical etching, leaving silicide contacts in the active regions of the device.

An interlevel dielectric material 44 can be deposited over the devices, with contacts 46 formed to the silicide contacts of the e.g., source/drain regions 34, base region 38, emitter region 40, isolation region 16 and collector region 20. The interlevel dielectric material 44 can be an oxide material deposited by a CVD process. The contacts 46 can be metal or metal alloy material, preferably composed of tungsten. The contacts 46 are formed by conventional lithography and etching processes through the interlevel dielectric material 44 to form trenches, followed by deposition of conductive material within the trenches. Any residual material on the interlevel dielectric material 44 can be removed by a CMP process.

Accordingly and as shown in FIG. 3, the n-type isolation region 16 and the trap rich isolation region 18 are vertically below the PNP collector of the HBT device 32, and the n-type isolation region 16 does not contact the trap rich isolation region 18. The high resistivity regions of the n-type isolation region 16 and the trap rich isolation region 18 reduce substrate leakage, device-to-device leakage, and improve collector-substrate breakdown and collector to sub-collector capacitance (Ccs). In addition, the high resistivity regions improve latch-up issues associated with PNP HBTs on a bulk wafer. For example, by using the buried trap rich region, Ccs can be reduced by approximate 27% and substrate leakage can be reduced by a factor of approximately 20×, compared to known SiGe HBT device.

Figure 4:
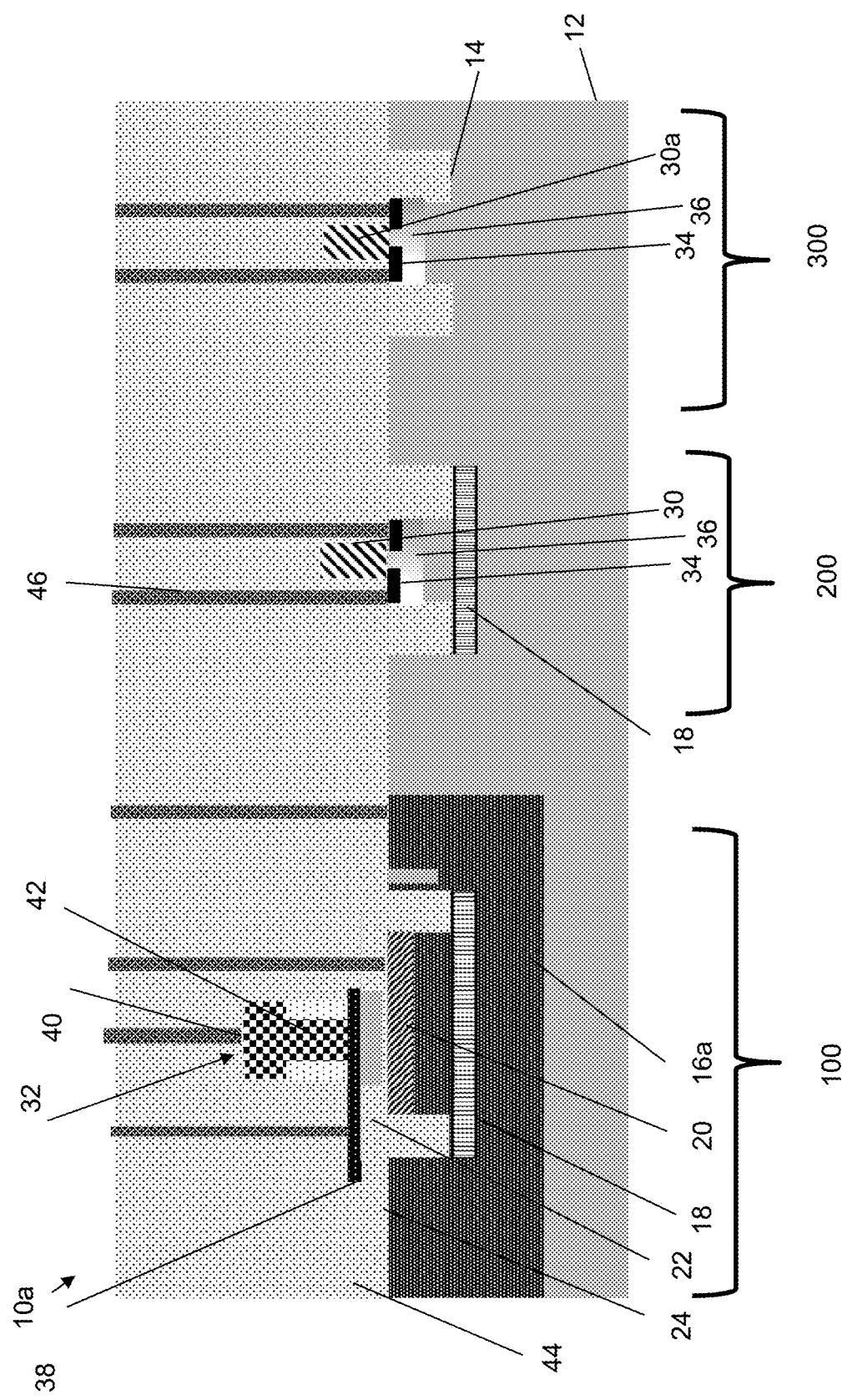
FIG. 4 shows an alternative structure in which a n-type isolation region is in contact with a trap rich isolation region and sub-collector region of a HBT device, amongst other features, and respective fabrication processes in accordance with aspects of the present disclosure.

FIG. 4 shows an alternative structure 10a in which the isolation region 16a, e.g., n-type isolation region, can be a well that contacts the trap rich isolation region 18 and the sub-collector region 20 in the HBT device region 100. In this embodiment, the substrate 12 can be doped with n-type dopant to form the n-well, e.g., isolation region 16a, which surrounds the shallow trench isolation structures 14 in the HBT device region 100. The trap rich isolation regions 18 and the sub-collector region 20 can be formed in the well 16a. The trap rich isolation region 18 can be formed by an argon implant (or other non-dopant or noble gas); whereas, the sub-collector region 20 can be formed by a p-type dopant implant process. The remaining features of FIG. 4 with like reference numerals are similar to that described in FIG. 3 such that no further explanation is required for a complete understanding of the structure 10a.

Figure 5:
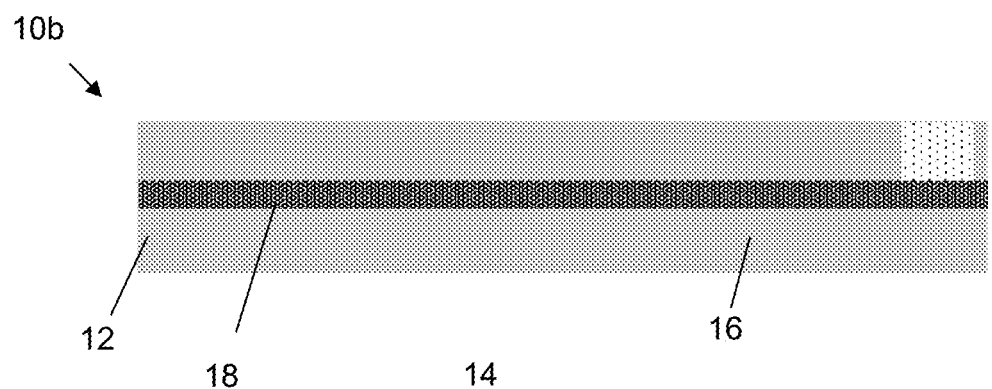

FIGS. 5-13 show fabrication processes and resultant complementary HBT devices over a trap rich isolation region. More specifically, FIG. 5 shows structure 10b comprising a substrate 12 with a trap rich isolation region 18 (e.g., layer) embedded therein. As in the previously disclosed embodiment, the substrate 12 can be composed of single crystalline semiconductor material. In this embodiment, the trap rich isolation region 18 can be formed by a blanket ion implant process of argon, non-dopant or a noble gas as already described herein. The depth of the trap rich isolation region 18 can be adjusted depending on the parameters of the implantation process as is known in the art such that no further explanation is required for a complete understanding of the present disclosure. In an alternative embodiment, the ion implant process of argon can be performed using a photomask to create certain regions of trap rich isolation on the wafer. Following the implant process, the substrate 12 undergoes an anneal process, as already described herein, to recrystallize the upper layer of the substrate 12 (e.g., material above the trap rich isolation region 18).

Figure 6:
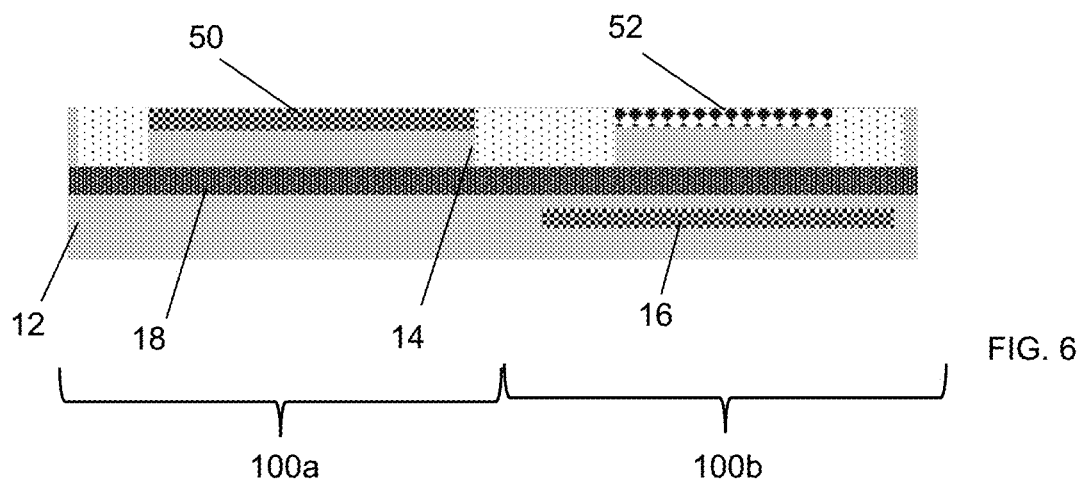

Alternatively, the trap rich isolation region 18 can be formed on a surface of the substrate 12, followed by an epitaxial growth process to form another substrate material over the trap rich isolation region 18. Following the implantation processes, the substrate 12 can be subjected to a rapid anneal process to recrystallize the epitaxial substrate, leaving the trap rich isolation region 18 embedded within single crystalline semiconductor material of the substrate 12 (and epitaxial substrate material). In an embodiment, another epitaxial step can be implemented to grow single crystal silicon such that the sub-collector region 16 can be buried in single crystalline material. This epitaxial step can be 0.1 μm to 2.0 μm in thickness though other thickness are also possible As shown in FIG. 6, shallow trench isolation structures 14 can be formed in the HBT device regions 100a, 100b of the substrate 12. The shallow trench isolation structures 14 can be formed by conventional lithography, etching and deposition methods known to those of skill in the art and as already described above. A buried isolation region 16 can be provided under the shallow trench isolation structures 14 in the HBT device region 100b, e.g., PNP device region. In embodiments, the buried isolation region 16 can be an n-type implant, which can be vertically separated from the trap rich isolation region 18 by the substrate 12.

A n-type sub-collector 50 can be formed between the shallow trench isolation structures 14 in the HBT device region 100a, e.g., NPN device region. In addition, a p-type sub-collector 52 can be formed between the shallow trench isolation structures 14 in the HBT device region 100b, e.g., PNP device region. Similar to the other implantation processes described herein, the buried isolation region 16, n-type sub-collector 50 and p-type sub-collector 52, are formed with appropriately patterned implantation masks and respective dopant types. In embodiments, both the n-type sub-collector 50 and the p-type sub-collector 52 can be bounded or constrained within the shallow trench isolation structures 14, in addition to being separated from the trap rich isolation region 18 below the shallow trench isolation structures 14. In embodiments, the trap rich isolation region 18 can be in contact with the shallow trench isolation structures 14.

Figure 7:
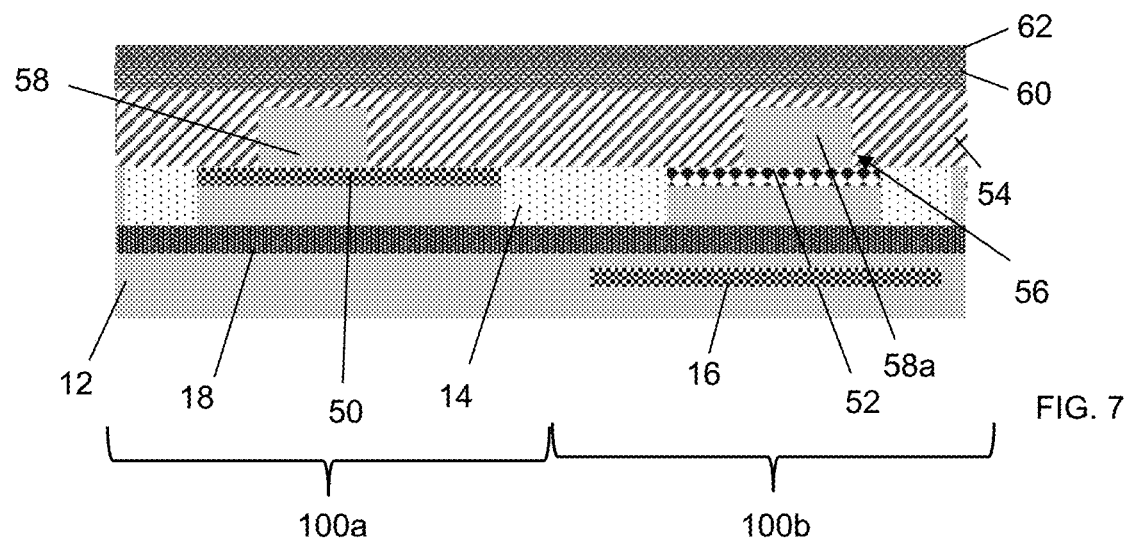

FIG. 7 shows formation of collector regions, amongst other features, in accordance with aspects of the present disclosure. More specifically, as shown in FIG. 7, a hardmask 54 can be deposited on the substrate 12, e.g., over the n-type sub-collector 50 and the p-type sub-collector 52 of the HBT device regions 100a, 100b. The hardmask 54 can be an oxide material deposited by a conventional CVD process. By a conventional lithography and etching process as is known in the art, openings 56 can be formed in the hardmask 54 to expose the n-type sub-collector 50 in the HBT device region 100a and the p-type sub-collector 52 in the HBT device region 100b. A collector region 58, 58a can be epitaxially grown over the exposed semiconductor material of the respective n-type sub-collector 50 and p-type sub-collector 52, within the opening 56. In embodiments, the collector regions 58, 58a can be intrinsic semiconductor material, e.g., Si material. A stack of materials, e.g., nitride material 60 and oxide material 62, are deposited on the collector regions 58, 58a and the hardmask material 54.

Figure 8:
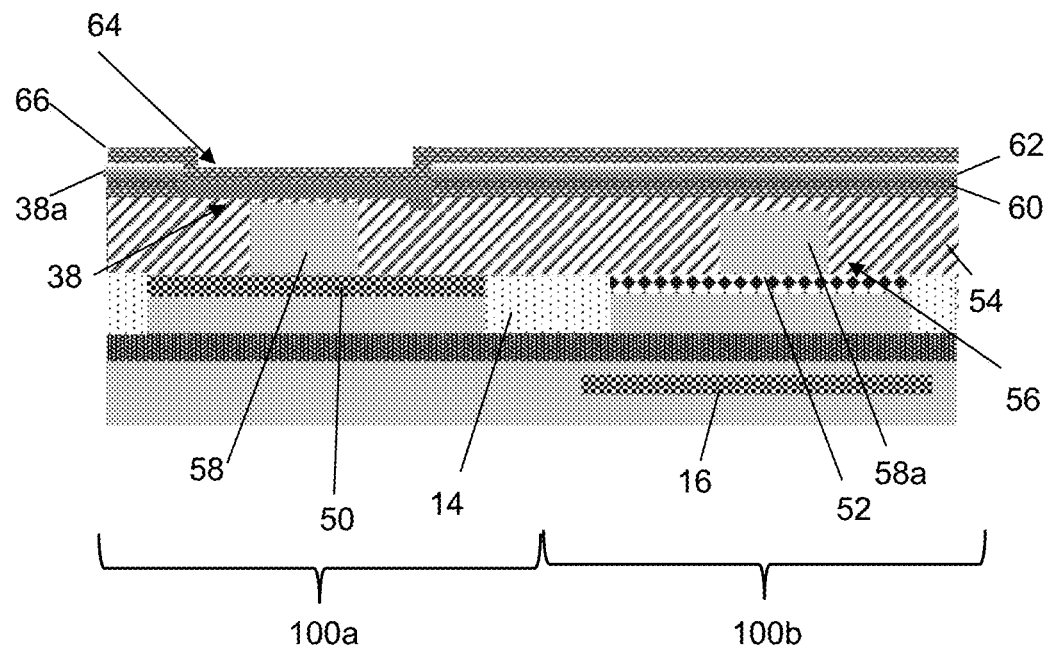

FIG. 8 shows a base region 38 formed on the n-type sub-collector 50 in the HBT device region 100a. In embodiments, the base region 38 can be an epitaxially grown single crystalline SiGe material. The epitaxially grown SiGe material can be a doped p-type SiGe material. To grow the SiGe material, an opening 64 can be formed in the nitride material 60 and oxide material 62 using conventional lithography and etching processes to expose the underlying n-type sub-collector 50. The SiGe material can be epitaxially grown on the exposed n-type collector 58 to form a single crystalline layer base region 38, with polysilicon based material 38a forming on the oxide material 62. Following the epitaxial growth process, a hard mask layer 66, e.g., a stack of nitride and oxide, can be deposited by conventional CVD processes over the epitaxially grown material 38, 38a.

Figure 9:
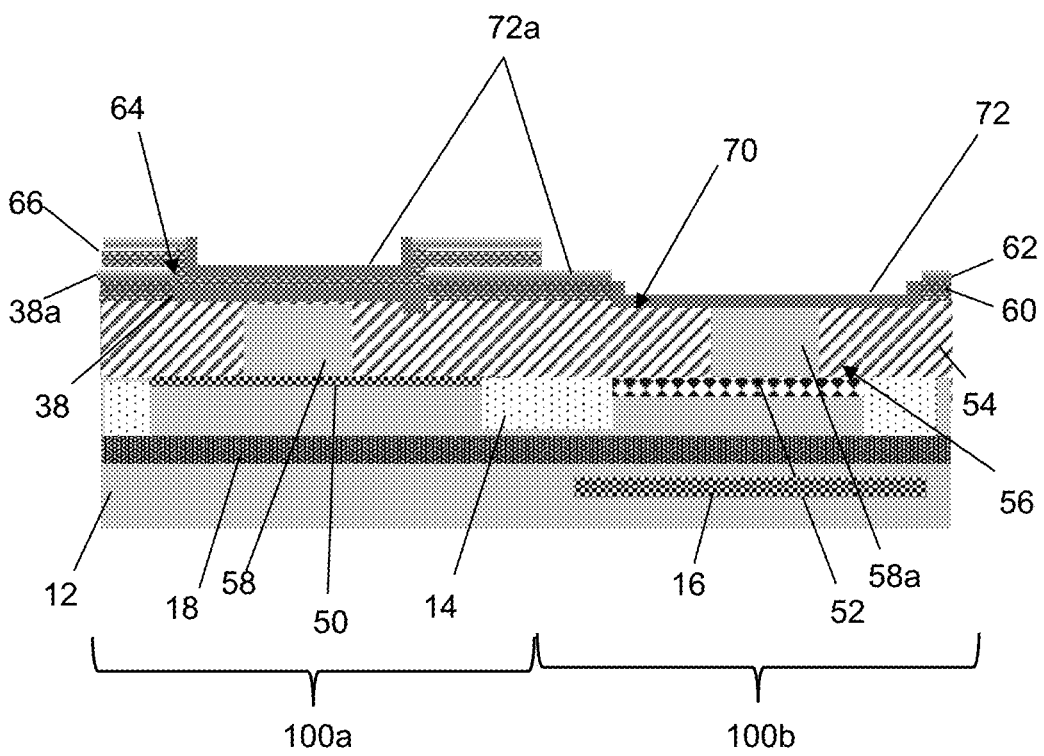

As further shown in FIG. 9, the hard mask 66 and polysilicon based material 38a can be patterned, e.g., partially etched, to expose the underlying mask, e.g., oxide material 62, on the HBT device regions 100b, An opening 70 can be formed in the stack of materials, e.g., nitride material 60 and oxide material 62, to expose the underlying collector region 58a in the HBT device region 100b. A base region 72 can be formed by growing semiconductor material in the opening 70 and in contact with the underlying collector region 58a for the PNP device. In embodiments, the deposition process can be an epitaxial deposition process, which forms a single crystalline material 72 within the opening 70 and polysilicon material 72a on other surfaces of the mask. In embodiments, the material for the base region 72 can be doped or undoped SiGe material. In the integration scheme of a doped SiGe material, such dopant would be n-type dopant.

Figure 10A:
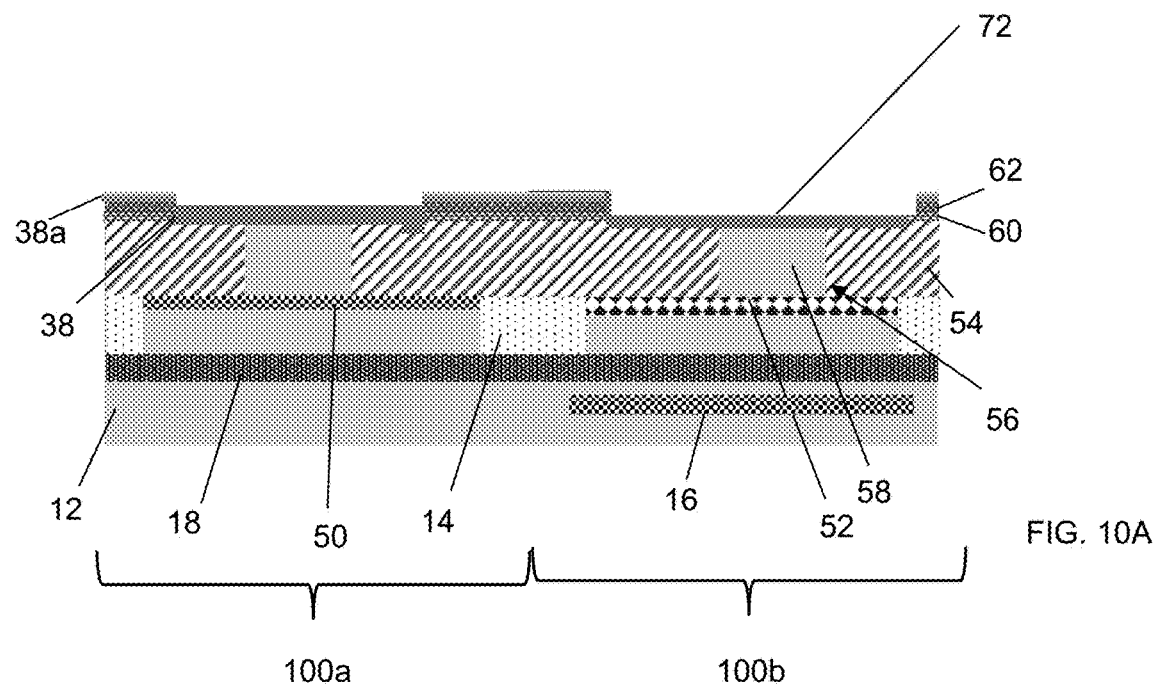
Figure 10B:
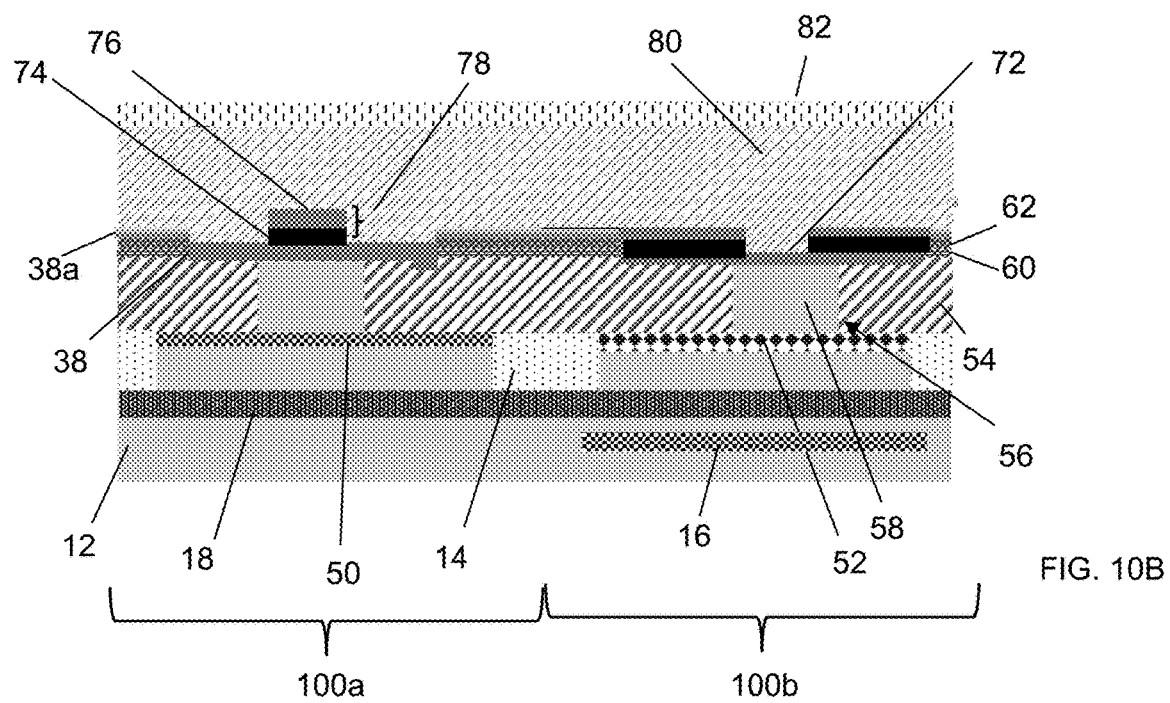

In FIGS. 10A and 10B, the mask 66 and polysilicon materials 38a, 72a are removed in the HBT device region 100a by lithography and etching processes. In embodiments, the polysilicon based material 72a can remain on the oxide material 62 in the HBT device region 100b. As should be understood by those of skill in the art, the lithography process includes a mask that blocks or prevents material from being etched over the HBT device region 100b. Moreover, the etching process can be a selective etch process, which can be any known combination of dry and wet etch chemistries, such that the base region 38 on the HBT device region 100a will not be eroded or removed.

Following the material removal process, an insulator material 74, e.g., oxide, and polysilicon based material 76 can be deposited and patterned on the exposed surfaces in the HBT device regions 100a, 100b. The patterning of these materials 74, 76 form part of an emitter region 78 on the base region 38 for the NPN device in the HBT device region 100a. The patterned materials 74, 76 can also remain on the base region 72 of the PNP device in the HBT device region 100b. A semiconductor material 80 can be formed, e.g., deposited, over the base region 72 and patterned materials 74, 76. In embodiments, the material 80 forms an emitter region of the PNP device in the HBT region 100b and an extrinsic base for the NPN device in the HBT device region 100a. The material 80 can be a P+ type material like silicon or SiGe or a combination of two and doped with p-type dopant like B. A capping layer 82 can be formed, e.g., deposited, by a conventional CVD process over the metal material 80.

In FIG. 11, a removal process, e.g., etching process, forms trenches 84 in both the HBT regions 100a, 100b. In embodiments, the trench 84 for the NPN device in the HBT device region 100a exposes the underlying oxide material 76 of the emitter region 78; whereas, the trench 84 for the PNP device in the HBT device region 100b exposes the oxide material 62. The etching process can be performed by conventional lithography and etching process, with a mask blocking regions that are not to be removed. A sidewall material 86 can be formed, e.g., deposited, within the trenches, followed by an anisotropic etching process to remove the material from any of the horizontal surfaces.

Figure 12:
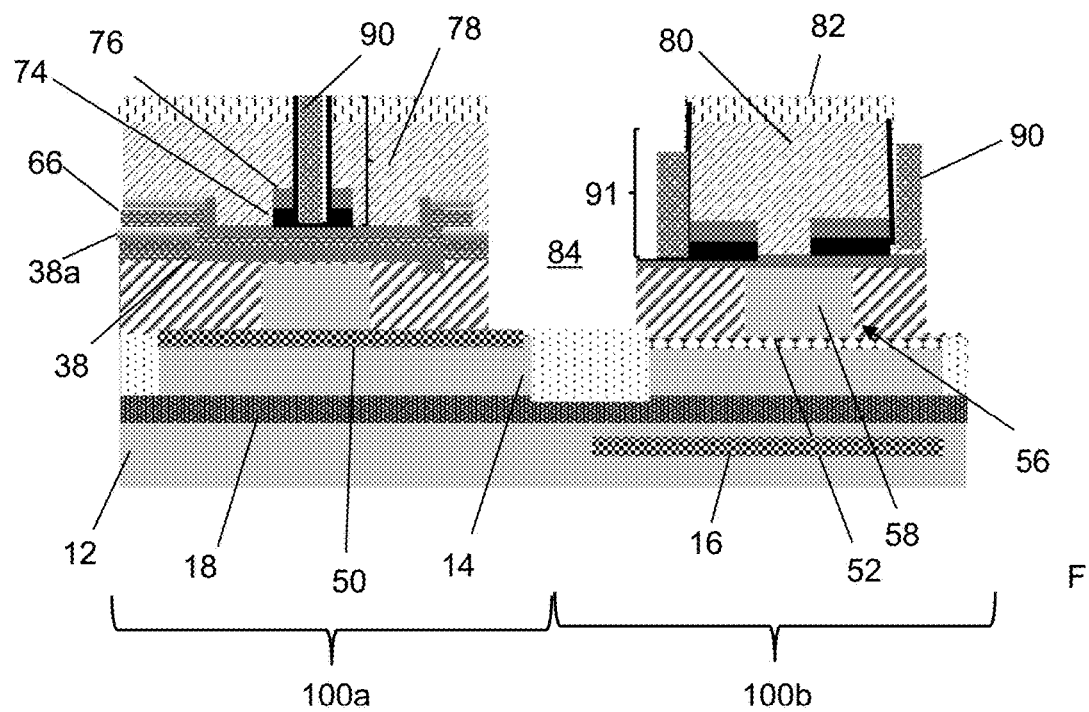

In FIG. 12, the etching process continues to remove the oxide material 74 of the emitter region 78, exposing the underlying base region 38. In addition, the etching process removes the exposed oxide material 62 in the HBT device region 100b. Following the removal process, the trench 84 for the NPN device in the HBT device region 100a can be filled with a semiconductor material 90 to complete the emitter region 78. The semiconductor material can be n-doped Si material deposited by a selective epitaxial growth process. Advantageously, this deposition process can also grow the semiconductor material 90 on the exposed semiconductor material of the base region 72 to form an extrinsic base region 91 for the PNP device in the HBT device region 100b. Accordingly, a single deposition process can be used for both the extrinsic base region 91 of the PNP device and the emitter region 78 for the NPN device. The trench 84 can be extended in both the HBT device regions 100a, 100b to expose the n-type sub-collector 50 and the p-type sub-collector 56, respectively.

Figure 13:
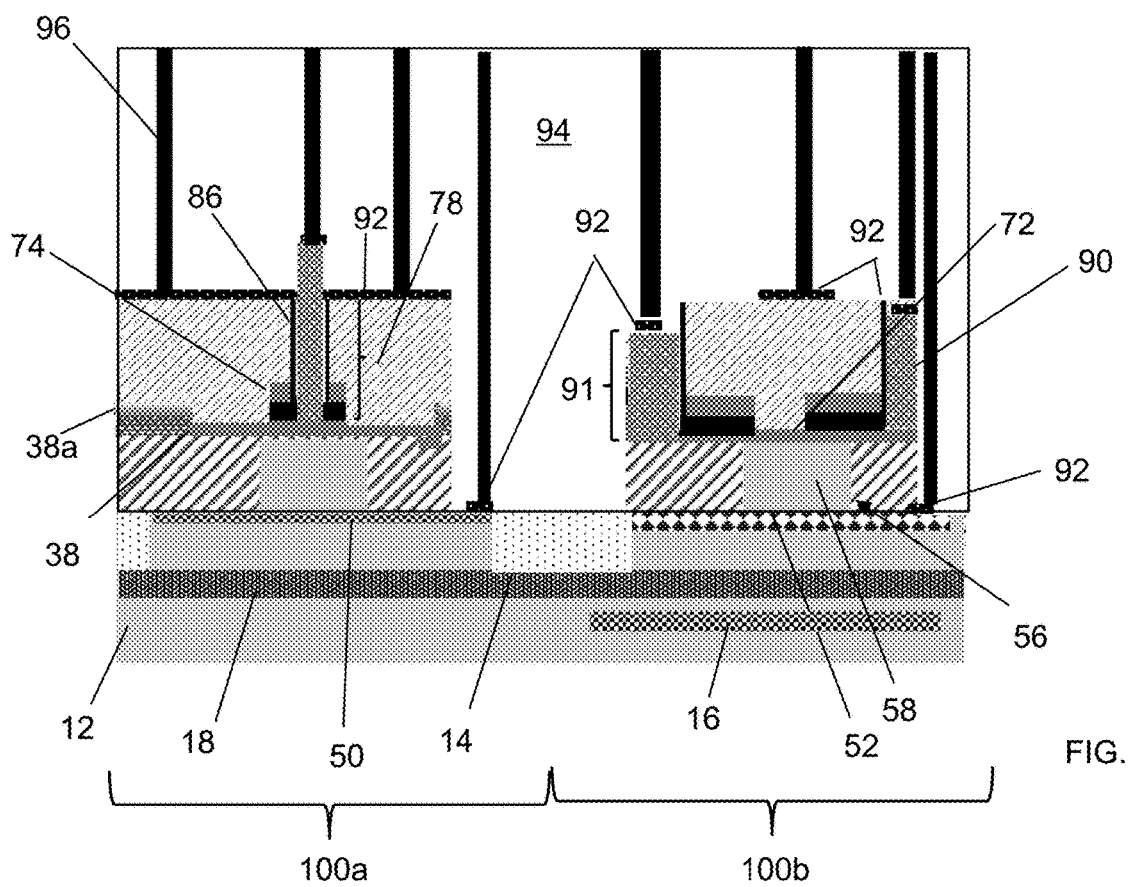

FIG. 13 shows contact formation to the NPN and PNP devices in the HBT device regions 100a, 100b. More specifically, following the formation of the respective devices, a silicide process can be provided to form silicide contacts 92 to the appropriate active regions, e.g., emitter regions, base region and collector regions, for both devices. An interlevel dielectric material 94 can be deposited over the devices, with contacts 96 formed to the silicide contacts of the emitter regions, base region and collector regions. The silicide contacts 92 and subsequent formation of the contacts 96 can be fabricated in a conventional manner as already described above.

Figure 14:
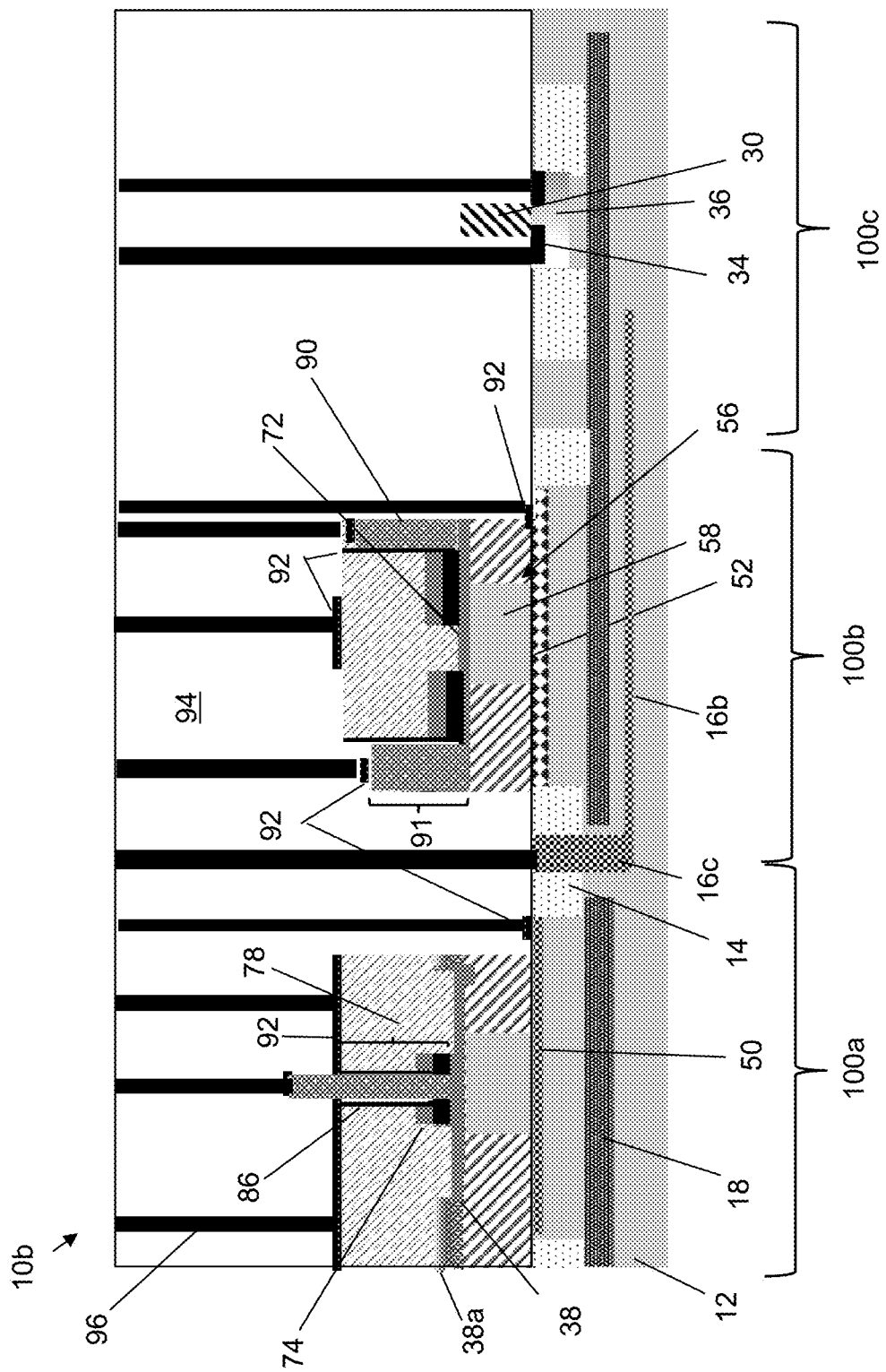
FIG. 14 shows alternative structure comprising complementary HBTs and a FET each of which have an underlying trap rich isolation regions in accordance with aspects of the present disclosure.

FIG. 14 shows alternative structures comprising complementary HBTs and a FET each of which have an underlying trap rich isolation regions. More specifically, the structure 10b of FIG. 14 includes an HBT region 100a, HBT region 100b and a FET region 100c. In embodiments, the HBT region 100a and HBT region 100b include respective NPN devices and PNP devices, with similar structures as described with reference to FIGS. 5-13. In the structure 10b, though, the trap rich isolation region 18 can now be separate regions, e.g., discontinuous, for the HBT device regions, 100a, 100b; however, the trap rich isolation region 18 can be shared for the HBT device region 100b and FET region 100c. In this scheme, the FET region includes a FET structure 30, similar to that described in FIGS. 3 and 4, e.g., switch or LNA FET. Also, in this integration scheme, the trap rich isolation regions 18 are still in contact with the shallow trench isolation structures 14 for each of the structures in each of the regions 100a, 100b, 100c, while also being separated from the well region 36 of the FET 30.

In addition, the buried isolation region 16b includes a shallow implant portion 16c extending to the surface of the substrate 12 (similar to that shown in the structure of FIGS. 1-3). Moreover, in this integration scheme, the shallow implant portion 16c of the isolation region 16b can be located between shallow trench isolation structure 14. In addition, a contact 96 extends to and can be in electrical contact to the shallow implant portion of the isolation region 16b.

The structures can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a first heterojunction bipolar transistor;
   a second heterojunction bipolar transistor; and
   a trap rich isolation region embedded within a substrate underneath both the first heterojunction bipolar transistor and the second heterojunction bipolar transistor, wherein the substrate comprises single crystalline semiconductor material and the trap rich isolation region comprises polysilicon crystalline semiconductor material embedded within the single crystalline semiconductor material and further comprising:

a first sub-collector region under a collector region of the first heterojunction bipolar transistor and a second sub-collector region under a collector region of the second heterojunction bipolar transistor, wherein the first sub-collector region and the second sub-collector region are separated from the polysilicon crystalline semiconductor material by an upper portion of the single crystalline semiconductor material and separated from one another by a shallow trench isolation structure; and a doped isolation region under and separated from the second heterojunction bipolar transistor by a lower portion of the single crystalline semiconductor material..

2. The structure of claim 1, wherein the first heterojunction bipolar transistor and the second heterojunction bipolar transistor are complementary heterojunction bipolar transistors.

3. The structure of claim 1, wherein the polysilicon crystalline semiconductor material is below shallow trench isolation structures for both the first heterojunction bipolar transistor and the second heterojunction bipolar transistor, and the second heterojunction bipolar transistor includes a n-type isolation region under and separated from the polycrystalline semiconductor material.

4. The structure of claim 1, wherein the first sub-collector region and the second sub-collector region have different dopant types.

5. The structure of claim 1, further comprising an emitter region of the first heterojunction bipolar transistor and a base region of the second heterojunction bipolar transistor comprise same material.

6. The structure of claim 1, wherein the trap rich isolation region comprises a single trap rich isolation region for both the first heterojunction bipolar transistor and the second heterojunction bipolar transistor.

7. The structure of claim 1, wherein the trap rich isolation region comprises separate isolation regions for the first heterojunction bipolar transistor and the second heterojunction bipolar transistor.

8. The structure of claim 1, further comprising a field effect transistor adjacent to the second heterojunction bipolar transistor, the field effect transistor, the first heterojunction bipolar transistor and the second heterojunction bipolar transistor sharing the trap rich isolation region.

9. The structure of claim 1, further comprising an isolation region under the shallow trench isolation structures and under the second heterojunction bipolar transistor.

10. The structure of claim 9, wherein the isolation region is under the polysilicon crystalline semiconductor material.

11. The structure of claim 9, wherein the isolation region comprises an n-type implant region and second bipolar heterojunction is a PNP device.

12. The structure of claim 9, wherein the isolation region is separated from the polysilicon crystalline semiconductor material by the single crystalline semiconductor material.

* * * * *